(12) United States Patent
Karagozler

(10) Patent No.: US 10,503,339 B2
(45) Date of Patent: *Dec. 10, 2019

(54) CONNECTOR INTEGRATION FOR SMART CLOTHING

(71) Applicant: Google LLC, Mountain View, CA (US)

(72) Inventor: Mustafa Emre Karagozler, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,949

(22) Filed: Jun. 19, 2019

(65) Prior Publication Data

US 2019/0302931 A1 Oct. 3, 2019

Related U.S. Application Data

(63) Continuation of application No. 15/799,154, filed on Oct. 31, 2017, now Pat. No. 10,338,757.

(Continued)

(51) Int. Cl.
*G06F 3/044* (2006.01)
*A41D 3/00* (2006.01)
(Continued)

(52) U.S. Cl.
CPC ........... *G06F 3/044* (2013.01); *A41B 1/08* (2013.01); *A41D 1/002* (2013.01); *A41D 3/00* (2013.01);
(Continued)

(58) Field of Classification Search
CPC .......... G06F 3/044; G06F 2203/04102; D03D 1/0088; D03D 2700/0166; H05K 1/038;
(Continued)

(56) References Cited

U.S. PATENT DOCUMENTS 5,564,571 A 10/1996 Zanotti
6,413,634 B1 7/2002 Tanaka et al.
(Continued)

FOREIGN PATENT DOCUMENTS

DE 20 2016 007 473 1/2017
DE 20 2016 007 476 1/2017
(Continued)

OTHER PUBLICATIONS

Haans et al., "Mediated Social Touch: A Review of Current Research and Future Directions", Virtual Reality, 2006, pp. 149-159.
(Continued)

*Primary Examiner* — Abhishek Sarma
(74) *Attorney, Agent, or Firm* — Dority & Manning, P.A.

(57) ABSTRACT

This document describes an interactive object with multiple electronics modules. An interactive object (e.g., a garment) includes a plurality of conductive threads woven into the interactive object, and an internal electronics module coupled to the array of conductive thread. The internal electronics module includes a first subset of electronic components, such as sensing circuitry configured to detect touch-input to the grid of conductive thread. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

20 Claims, 12 Drawing Sheets

Related U.S. Application Data

(60) Provisional application No. 62/469,216, filed on Mar. 9, 2017.

(51) Int. Cl.
*D03D 1/00* (2006.01)
*H05K 1/03* (2006.01)
*A43B 3/00* (2006.01)
*A41D 1/00* (2018.01)
*A41B 1/08* (2006.01)
*A41B 7/00* (2006.01)

(52) U.S. Cl.
CPC ......... *A43B 3/0005* (2013.01); *D03D 1/0088* (2013.01); *H05K 1/038* (2013.01); *A41B 7/00* (2013.01); *A41D 1/005* (2013.01); *D03D 2700/0166* (2013.01); *D10B 2401/18* (2013.01); *G06F 2203/04102* (2013.01); *H01H 2203/0085* (2013.01); *H05K 2201/0278* (2013.01)

(58) Field of Classification Search
CPC .. H05K 2201/0278; A41D 3/00; A41D 1/002; A41D 1/005; A41B 1/08; A41B 7/00; A43B 3/0005; D10B 2401/18; H01H 2203/0085
See application file for complete search history.

(56) References Cited

U.S. PATENT DOCUMENTS

| | | | |
|---|---|---|---|
| 6,794,008 B2 | 9/2004 | Wildeman | |
| 7,028,509 B2 | 4/2006 | Mitchell et al. | |
| 7,365,031 B2 | 4/2008 | Swallow et al. | |
| 7,462,035 B2 | 12/2008 | Lee et al. | |
| 7,791,700 B2 | 9/2010 | Bellamy | |
| 7,834,276 B2 | 11/2010 | Chou et al. | |
| 9,035,188 B2 | 5/2015 | Akiba et al. | |
| 2004/0259391 A1* | 12/2004 | Jung | D03D 1/0082 439/37 |
| 2007/0026695 A1 | 2/2007 | Lee et al. | |
| 2009/0203244 A1 | 8/2009 | Den Toonder et al. | |
| 2013/0161078 A1 | 6/2013 | Li | |
| 2016/0017521 A1 | 1/2016 | Thomson et al. | |
| 2016/0048235 A1* | 2/2016 | Poupyrev | G06F 3/044 345/174 |
| 2016/0100480 A1 | 4/2016 | Van Keymeulen et al. | |
| 2017/0325337 A1 | 11/2017 | Karagozler et al. | |
| 2017/0329425 A1 | 11/2017 | Karagozler et al. | |

FOREIGN PATENT DOCUMENTS

| | | |
|---|---|---|
| JP | 2014/214397 | 11/2014 |
| JP | 2016/047004 | 4/2016 |
| WO | WO 01/15286 | 3/2001 |
| WO | WO 2010/086034 | 8/2010 |

OTHER PUBLICATIONS

International Search Report for PCT/US2017/059166 dated Jan. 22, 2018, 11 pages.

* cited by examiner

CONNECTOR INTEGRATION FOR SMART CLOTHING

RELATED APPLICATIONS

The present application is a continuation of U.S. application Ser. No. 15/799,154, filed on Oct. 31, 2017, which claims priority to U.S. Provisional Patent Application Ser. No. 62/469,216, filed Mar. 9, 2017. Applicant claims priority to and the benefit of U.S. application Ser. No. 15/799,154 and U.S. Provisional Patent Application Ser. No. 62/469, 216, and hereby incorporates each of such applications by reference herein in its entirety.

BACKGROUND

An interactive textile includes conductive thread woven into the interactive textile to form a capacitive touch sensor that is configured to detect touch-input. The interactive textile can process the touch-input to generate touch data that is useable to initiate functionality at various remote devices that are wirelessly coupled to the interactive textile. For example, the interactive textile may aid users in controlling volume on a stereo, pausing a movie playing on a television, or selecting a webpage on a desktop computer. Due to the flexibility of textiles, the interactive textile may be easily integrated within flexible objects, such as clothing, handbags, fabric casings, hats, and so forth.

The interactive textile includes a grid or array of conductive thread woven into the interactive textile. Each conductive thread includes a conductive wire (e.g., a copper wire) that is twisted, braided, or wrapped with one or more flexible threads (e.g., polyester or cotton threads). It is difficult, however, for manufacturers to attach individual conductive threads to electronic components that may include electronics such as a processor, battery, wireless unit, sensors, and so forth.

SUMMARY

This document describes techniques and apparatuses for connecting an electronic component to an interactive textile. An interactive textile may include conductive thread woven into the interactive textile to form a capacitive touch sensor that is configured to detect touch-input.

This document also describes an interactive object with multiple electronic modules. An interactive object (e.g., a garment) includes a grid or array of conductive thread woven into the interactive object, and an internal electronics module coupled to the grid of conductive thread. The internal electronics module includes a first subset of electronic components, such as sensing circuitry configured to detect touch-input to the conductive threads. An external electronics module that includes a second subset of electronic components (e.g., a microprocessor, power source, or network interface) is removably coupled to the interactive object via a communication interface. The communication interface enables communication between the internal electronics module and the external electronics module when the external electronics module is coupled to the interactive object.

In one embodiment, the present disclosure is directed to an interactive object that includes a plurality of conductive threads integrated into the interactive object. The conductive threads have a first end and a second end. The conductive threads can be substantially linear and parallel from the first end to the second end. The interactive object can further include an internal electronics module coupled to the plurality of conductive threads. The internal electronics module can include a flexible substrate having a width and a length. A plurality of electrical contact pads are positioned sequentially along the width of the flexible substrate. Each electrical contact pad is connected to a respective conductive thread. In one embodiment, for instance, the conductive thread can be soldered to a corresponding electrical contact pad.

The interactive object can further include a controller in electrical communication with each of the electrical contact pads. The controller can be configured to detect a touch-input when user pressure is applied to the conductive threads. The controller can also be configured to communicate the touch-input data to a computing device.

In one embodiment, the interactive object can further include an external electronics module that is removably coupled to the interactive object for communicating with the internal electronics module. The interactive object, for instance, can comprise a wearable garment, such as a shirt, a jacket, or footwear.

In one embodiment, the flexible substrate and the electrical contact pads of the internal electronics module can comprise a flexible printed circuit board. The printed circuit board can include a first portion where the electrical contact pads are located and a second portion comprising a microprocessor. The second portion of the printed circuit board can be overmolded with a polymer composition.

In one embodiment, the first end of each conductive thread is connected to a respective electrical contact pad. The first end of each conductive thread can include a free end section not integrated into the interactive object. For instance, the free end section can be a portion of the conductive thread where the conductive thread is not woven into a fabric used to make the interactive object. In accordance with the present disclosure, each end section of each conductive thread can include slack between the electrical contact pad and the location where the end section enters the interactive object. The slack, for instance, can have an S-like configuration between the electrical contact pad and the location where the end section enters the interactive object. Slack is incorporated into the end sections in order to provide strain relief when the interactive object is being used, such as when being worn by a user or being subjected to laundry cycles if the interactive object comprises a wearable garment. The amount of slack present in the end section can vary depending upon the particular application. In one embodiment, for instance, the slack has a distance that is at least 50% greater, such as at least 80% greater, such as at least 100% greater than the linear distance between the location on the electrical contact pad where the conductive thread is connected and the location where the end section is integrated into the interactive object.

As described above, in one embodiment, the conductive threads are soldered to the electrical contact pads. In one embodiment, in order to provide durability, the connection sites are covered with a rigid adhesive, such as an epoxy. In one embodiment, the connection sites coated with the rigid adhesive are then encapsulated within a polymer. The polymer, for instance, may comprise an elastomeric polymer.

In one embodiment, the external electronics module includes a connector plug that connects to a receptacle on the internal electronics module. In one embodiment, the receptacle on the internal electronics module can include a sealing ring for facilitating attachment to the external electronics module. In addition, the internal and external electronics modules can include an alignment device for aligning the two modules when attached together. For instance, the receptacle on the internal electronics module can include a pin recess that is designed to receive an alignment pin located on the external electronics module.

In one embodiment the internal electronics module further includes a ramp portion that extends from a surface of the interactive object to the plurality of electrical contact pads, the conductive threads being positioned on the ramp portion when extending from the interactive object to the electrical contact pads.

In a further embodiment, the internal electronics module comprises a sensing circuitry, in particular with a self-capacitance sensor and/or a projective capacitance sensor.

This document also describes a system with multiple electronic modules.

This summary is provided to introduce simplified concepts concerning an interactive object with multiple electronics modules, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of an interactive object with multiple electronics modules are described with reference to the following drawings. The same numbers are used throughout the drawings to reference like features and components.

DETAILED DESCRIPTION

Overview

Figure 1:
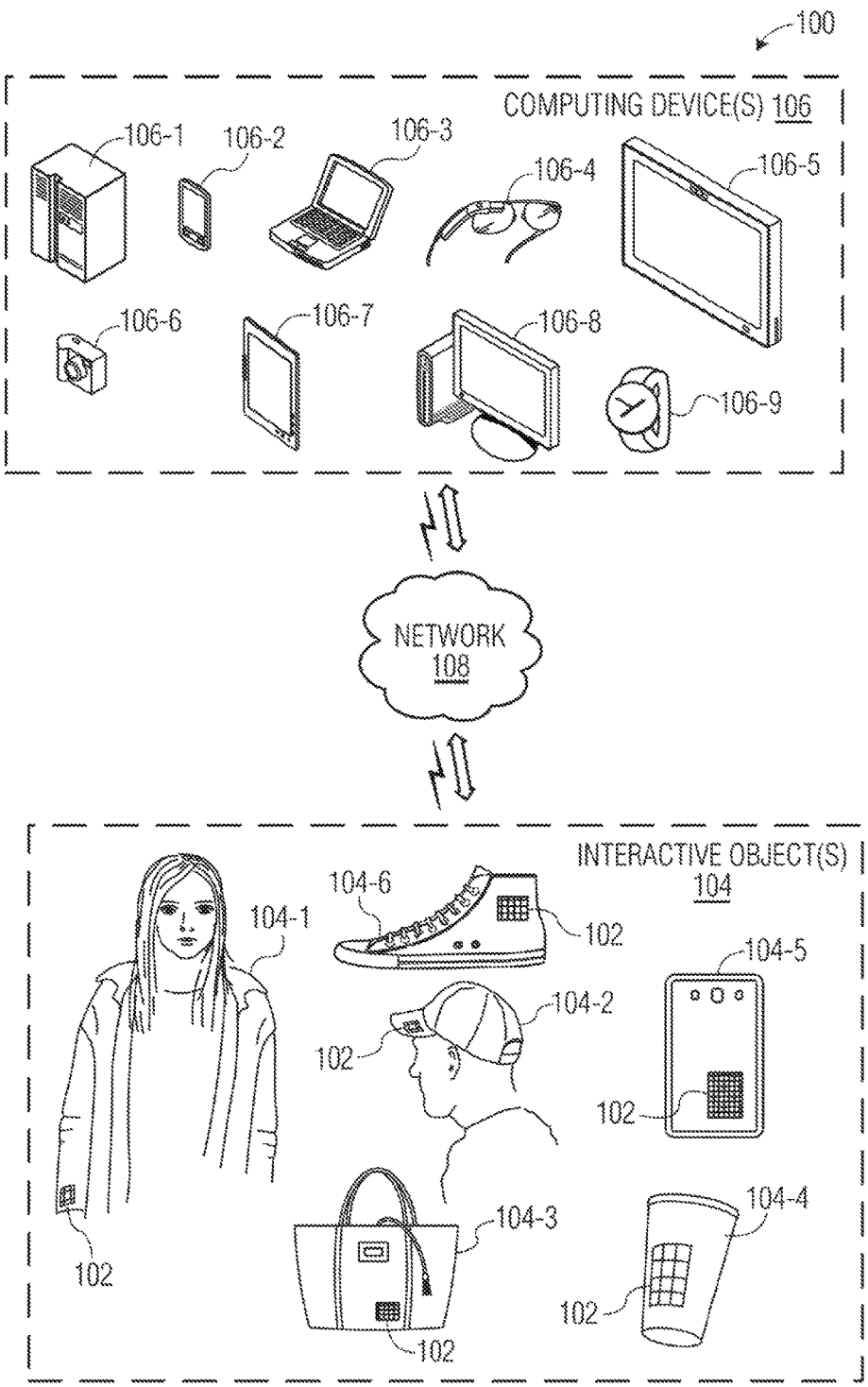
FIG. 1 is an illustration of an example environment in which an interactive textile with multiple electronics modules can be implemented.

Electronics embedded in garments and other flexible objects (e.g., blankets, handbags, and hats) are becoming increasingly common. Such electronics often need connectivity to external devices for power and/or data transmission. For example, it can be difficult to integrate bulky electronic components (e.g., batteries, microprocessors, wireless units, and sensors) into wearable garments, such as a shirt, coat, a shoe, or pair of pants. Furthermore, connecting such electronic components to a garment may cause issues with durability since garments are often washed. However, some electronic components, such as sensing circuitry, are better equipped to be positioned within the garment.

An interactive object with multiple electronics modules is described. An interactive object (e.g., a garment) includes at least an internal electronics module containing a first subset of electronic components for the interactive object, and an external electronics module containing a second subset of electronic components for the interactive object. As described herein, the internal electronics module may be physically and permanently coupled to the interactive object, whereas the external electronics module may be removably coupled to the interactive object. Thus, instead of integrating all of the electronics within the interactive object, at least some of the electronics are placed in the external electronics module.

In one or more implementations, the interactive object includes an interactive textile with conductive threads woven into the textile to form a flexible touch pad. The internal electronics module contains sensing circuitry that is directly coupled to the conductive threads to enable the detection of touch-input to the interactive textile. The external electronics module contains electronic components that are needed to process and communicate the touch-input data, such as a microprocessor, a power source, a network interface, and so forth.

The interactive object further includes a communication interface configured to enable communication between the internal electronics module and the external electronics module. In some implementations, the communication interface may be implemented as a connector that connects the electronic components in the external electronics module to the electronic components in the internal electronics module to enable the transfer of power and data between the modules. The connector may include a connector plug and a connector receptacle. For example, the connector plug may be implemented at the external electronics module and is configured to connect to the connector receptacle, which may be implemented at the interactive object.

Thus, while the electronic components are separated into multiple different modules, the communication interface enables the system to function as a single unit. For example, the power source contained within the external electronics module may transfer power, via the communication interface, to the sensing circuitry of the internal electronics module to enable the sensing circuitry to detect touch-input to the conductive thread. When touch-input is detected by the sensing circuitry of the internal electronics module, data representative of the touch-input may be communicated, via the communication interface, to the microprocessor contained within the external electronics module. The microprocessor may then analyze the touch-input data to generate one or more control signals, which may then be communicated to a remote computing device (e.g., a smart phone) via the network interface to cause the computing device to initiate a particular functionality.

Separating the electronics of the interactive object into multiple different modules provides a variety of different benefits. For example, the system design enables interoperability and customization because the external electronics module can be detached from the interactive object, and then attached to a different interactive object to carry over some of the functions and properties, such as user specific settings. Additionally, by separating the garment embedded electronics from the external electronics module, users, designers and companies are able to design the external electronics modules in the form factor, mechanical, material and surface finish qualities that are specific to the application or the user. For example, a leather jacket might have an external electronics module that is leather, and in the form of a strap that matches a certain jacket style, or allows a flexible form factor that would have been hard to achieve inside a garment.

Furthermore, separating the electronics enable broken parts to be easily replaced or serviced without the need to access the entire interactive object. For example, the external electronics module can be shipped to a repair service, or a new external electronics module can be purchased without the need to purchase a new interactive object. In addition, separating the electronic components into internal and external modules ensures that parts such as batteries are not exposed to washing cycles that a typical garment would go through. For example, the external electronics module, which may include the battery, can easily be removed from the interactive object before washing the interactive object. Furthermore, by separating parts, the manufacturing challenges are significantly simplified and certification processes (such as FCC certification for RF transmission units) can be handled over the part in question, thereby reducing the complexity.

Example Environment

FIG. 1 is an illustration of an example environment 100 in which an interactive textile with multiple electronics modules can be implemented. Environment 100 includes an interactive textile 102, which is shown as being integrated within various interactive objects 104. Interactive textile 102 is a textile that is configured to sense multi-touch-input. As described herein, a textile corresponds to any type of flexible woven material consisting of a network of natural or artificial fibers, often referred to as thread or yarn. Textiles may be formed by weaving, knitting, crocheting, knotting, pressing threads together or consolidating fibers or filaments together in a nonwoven manner.

In environment 100, interactive objects 104 include "flexible" objects, such as a shirt 104-1, a hat 104-2, a handbag 104-3 and a shoe 104-6. It is to be noted, however, that interactive textile 102 may be integrated within any type of flexible object made from fabric or a similar flexible material, such as garments or articles of clothing, blankets, shower curtains, towels, sheets, bed spreads, or fabric casings of furniture, to name just a few. Interactive textile 102 may be integrated within flexible objects 104 in a variety of different ways, including weaving, sewing, gluing, and so forth.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. Interactive textile 102 may be integrated within hard objects 104 using a variety of different manufacturing processes. In one or more implementations, injection molding is used to integrate interactive textiles 102 into hard objects 104.

Interactive textile 102 enables a user to control object 104 that the interactive textile 102 is integrated with, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desktop 106-8, and smart watch 106-9, though other devices may also be used, such as home automation and control systems, sound or entertainment systems, home appliances, security systems, netbooks, and ereaders. Note that computing device 106 can be wearable (e.g., computing spectacles and smart watches), non-wearable but mobile (e.g., laptops and tablets), or relatively immobile (e.g., desktops and servers).

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Interactive textile 102 can interact with computing devices 106 by transmitting touch data through network 108. Computing device 106 uses the touch data to control computing device 106 or applications at computing device 106. As an example, consider that interactive textile 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on interactive textile 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by interactive textile 102.

Figure 2:
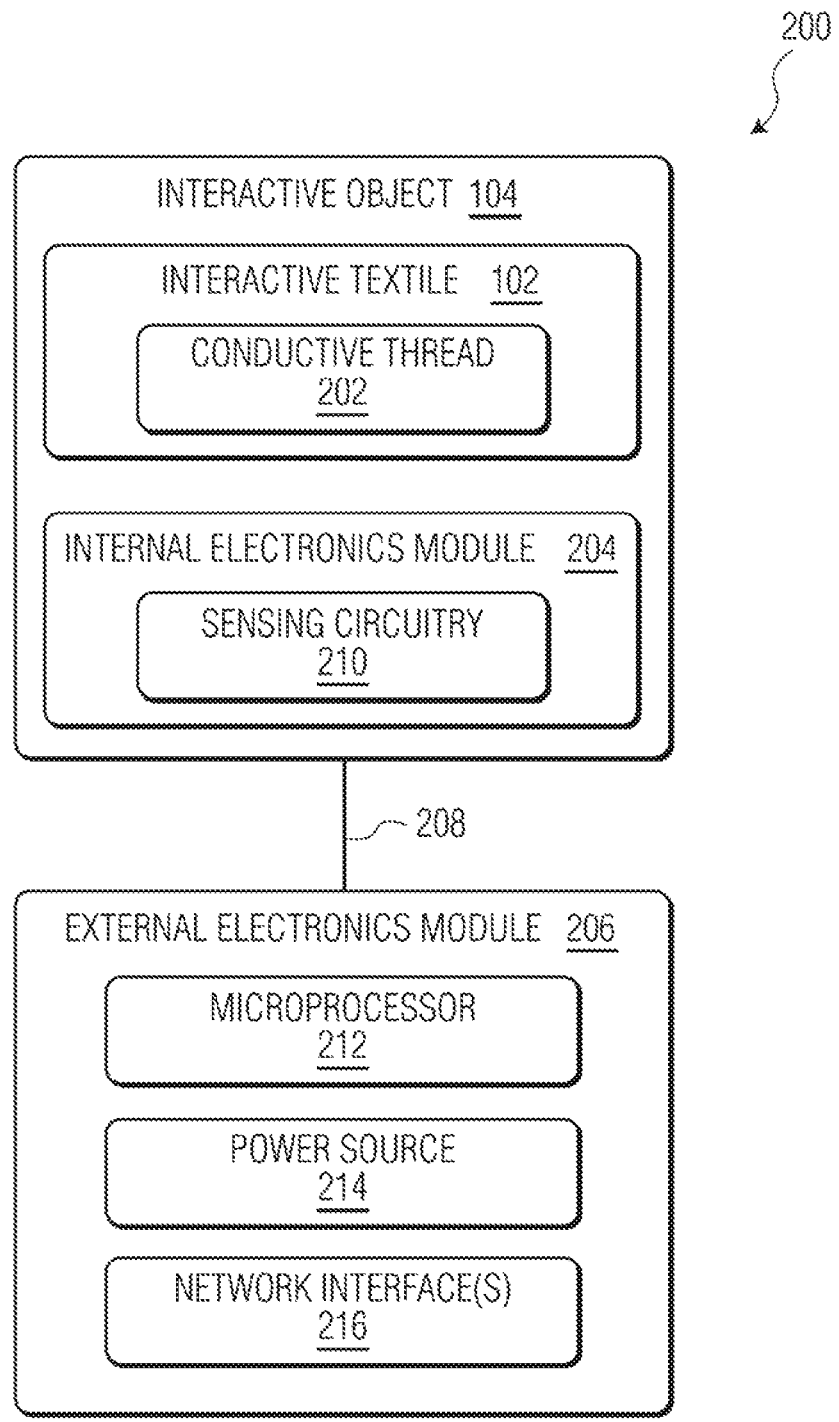
FIG. 2 illustrates an example system that includes an interactive object and multiple electronics modules.

In more detail, consider FIG. 2 which illustrates an example system 200 that includes an interactive object and multiple electronics modules. In system 200, interactive textile 102 is integrated in an object 104, which may be implemented as a flexible object (e.g., shirt 104-1, hat 104-2, or handbag 104-3) or a hard object (e.g., plastic cup 104-4 or smart phone casing 104-5).

Interactive textile 102 is configured to sense multi-touch-input from a user when one or more fingers of the user's hand touch interactive textile 102. Interactive textile 102 may also be configured to sense full-hand touch-input from a user, such as when an entire hand of the user touches or swipes interactive textile 102. To enable the detection of touch-input, interactive textile 102 includes conductive threads 202, which are woven into interactive textile 102 (e.g., in a grid, array or parallel pattern). Notably, the conductive threads 202 do not alter the flexibility of interactive textile 102, which enables interactive textile 102 to be easily integrated within interactive objects 104.

Interactive object 104 includes an internal electronics module 204 that is embedded within interactive object 104 and is directly coupled to conductive threads 202. Internal electronics module 204 can be communicatively coupled to an external electronics module 206 via a communication interface 208. Internal electronics module 204 contains a first subset of electronic components for the interactive object 104, and external electronics module 206 contains a second, different, subset of electronics components for the interactive object 104. As described herein, the internal electronics module 204 may be physically and permanently embedded within interactive object 104, whereas the external electronics module 206 may be removably coupled to interactive object 104.

In system 200, the electronic components contained within the internal electronics module 204 includes sensing circuitry 210 that is coupled to conductive thread 202 that is woven into interactive textile 102. For example, wires from the conductive threads 202 may be connected to sensing circuitry 210 using flexible PCB, creping, gluing with conductive glue, soldering, and so forth. In one embodiment, the sensing circuitry 210 can be configured to detect a user-inputted touch-input on the conductive threads that is pre-programmed to indicate a certain request. In one embodiment, when the conductive threads form a grid or other pattern, sensing circuitry 210 can be configured to also detect the location of the touch-input on conductive thread 202, as well as motion of the touch-input. For example, when an object, such as a user's finger, touches conductive thread 202, the position of the touch can be determined by sensing circuitry 210 by detecting a change in capacitance on the grid or array of conductive thread 202. The touch-input may then be used to generate touch data usable to control computing device 106. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile).

Communication interface 208 enables the transfer of power and data (e.g., the touch-input detected by sensing circuitry 210) between the internal electronics module 204 and the external electronics module 206. In some implementations, communication interface 208 may be implemented as a connector that includes a connector plug and a connector receptacle. The connector plug may be implemented at the external electronics module 206 and is configured to connect to the connector receptacle, which may be implemented at the interactive object 104. A more-detailed discussion of example connectors is discussed below with regards to FIGS. 4 and 11-12.

In system 200, the external electronics module 206 includes a microprocessor 212, power source 214, and network interface 216. Power source 214 may be coupled, via communication interface 208, to sensing circuitry 210 to provide power to sensing circuitry 210 to enable the detection of touch-input, and may be implemented as a small battery. When touch-input is detected by sensing circuitry 210 of the internal electronics module 204, data representative of the touch-input may be communicated, via communication interface 208, to microprocessor 212 of the external electronics module 206. Microprocessor 212 may then analyze the touch-input data to generate one or more control signals, which may then be communicated to computing device 106 (e.g., a smart phone) via the network interface 216 to cause the computing device 106 to initiate a particular functionality. Generally, network interfaces 216 are configured to communicate data, such as touch data, over wired, wireless, or optical networks to computing devices 106. By way of example and not limitation, network interfaces 216 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1).

While internal electronics module 204 and external electronics module 206 are illustrated and described as including specific electronic components, it is to be appreciated that these modules may be configured in a variety of different ways. For example, in some cases, electronic components described as being contained within internal electronics module 204 may be at least partially implemented at the external electronics module 206, and vice versa. Furthermore, internal electronics module 204 and external electronics module 206 may include electronic components other that those illustrated in FIG. 2, such as sensors, light sources (e.g., LED's), displays, speakers, and so forth.

Figure 3:
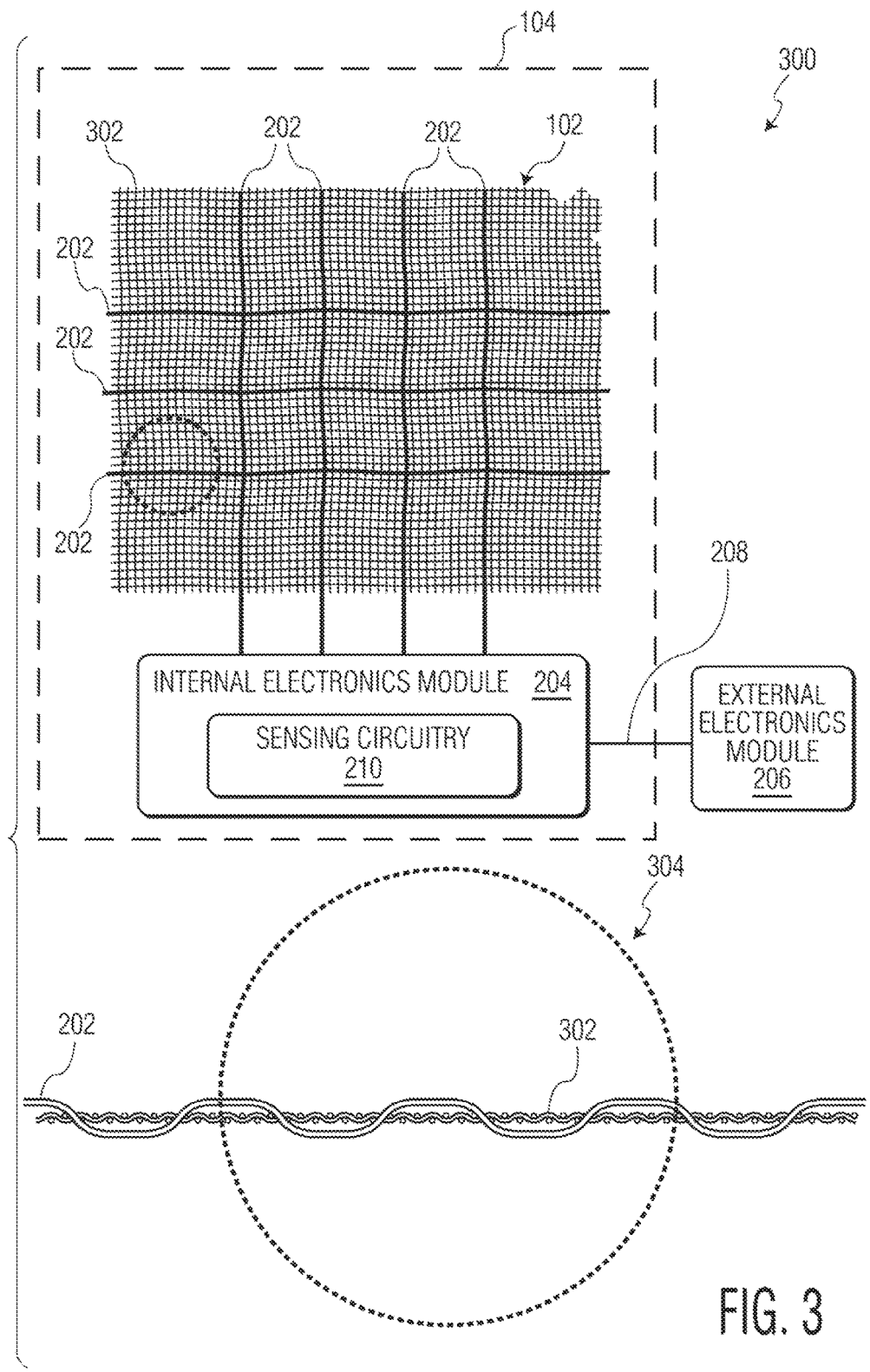
FIG. 3 illustrates an example of an interactive object with multiple electronics modules in accordance with one or more implementations.

FIG. 3 illustrates an example 300 of interactive object 104 with multiple electronics modules in accordance with one or more implementations. In this example, interactive textile 102 of the interactive object 104 includes non-conductive threads 302 woven with conductive threads 202 to form interactive textile 102. Non-conductive threads 302 may correspond to any type of non-conductive thread, fiber, or fabric, such as cotton, wool, silk, nylon, polyester, and so forth.

At 304, a zoomed-in view of conductive thread 202 is illustrated. Conductive thread 202 includes a conductive wire or a plurality of conductive filaments that are twisted, braided, or wrapped with a flexible thread. As shown, the conductive thread 202 can be woven with an integrated with the non-conductive threads 302 to form a fabric or a textile.

In one or more implementations, conductive thread 202 includes a thin copper wire. It is to be noted, however, that the conductive thread 202 may also be implemented using other materials, such as silver, gold, or other materials coated with a conductive polymer. The conductive thread 202 may include an outer cover layer formed by braiding together non-conductive threads. The non-conductive threads may be implemented as any type of flexible thread or fiber, such as cotton, wool, silk, nylon, polyester, and so forth.

Interactive textile 102 can be formed cheaply and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 302 with conductive threads 202 to create interactive textile 102.

The conductive threads 202 can be woven into the textile 102 in any suitable pattern or array. In one embodiment, for instance, the conductive threads 202 may form a single series of parallel threads. For instance, in one embodiment, the capacitive touch sensor may comprise a single plurality of parallel conductive threads conveniently located on the interactive object, such as on the sleeve of a jacket.

In an alternative embodiment, the conductive threads 202 may form a grid as shown in FIG. 3.

In example 300, conductive thread 202 is woven into interactive textile 102 to form a grid that includes a set of substantially parallel conductive threads 202 and a second set of substantially parallel conductive threads 202 that crosses the first set of conductive threads to form the grid. In this example, the first set of conductive threads 202 are oriented horizontally and the second set of conductive threads 202 are oriented vertically, such that the first set of conductive threads 202 are positioned substantially orthogonal to the second set of conductive threads 202. It is to be appreciated, however, that conductive threads 202 may be oriented such that crossing conductive threads 202 are not orthogonal to each other. For example, in some cases crossing conductive threads 202 may form a diamond-shaped grid. While conductive threads 202 are illustrated as being spaced out from each other in FIG. 3, it is to be noted that conductive threads 202 may be weaved very closely together. For example, in some cases two or three conductive threads may be weaved closely together in each direction. Further, in some cases the conductive threads may be oriented as parallel sensing lines that do not cross or intersect with each other.

In example 300, sensing circuitry 210 is shown as being integrated within object 104, and is directly connected to conductive threads 202. During operation, sensing circuitry 210 can determine positions of touch-input on the grid of conductive thread 202 using self-capacitance sensing or projective capacitive sensing.

For example, when configured as a self-capacitance sensor, sensing circuitry 210 charges crossing conductive threads 202 (e.g., horizontal and vertical conductive threads) by applying a control signal (e.g., a sine signal) to each conductive thread 202. When an object, such as the user's finger, touches the grid of conductive thread 202, the conductive threads 202 that are touched are grounded, which changes the capacitance (e.g., increases or decreases the capacitance) on the touched conductive threads 202.

Sensing circuitry 210 uses the change in capacitance to identify the presence of the object. To do so, sensing circuitry 210 detects a position of the touch-input by detecting which horizontal conductive thread 202 is touched, and which vertical conductive thread 202 is touched by detecting changes in capacitance of each respective conductive thread 202. Sensing circuitry 210 uses the intersection of the crossing conductive threads 202 that are touched to determine the position of the touch-input on the grid of conductive threads 202. For example, sensing circuitry 210 can determine touch data by determining the position of each touch as X,Y coordinates on the grid of conductive thread 202.

When implemented as a self-capacitance sensor, "ghosting" may occur when multi-touch-input is received. Consider, for example, that a user touches the grid of conductive thread 202 with two fingers. When this occurs, sensing circuitry 210 determines X and Y coordinates for each of the two touches. However, sensing circuitry 210 may be unable to determine how to match each X coordinate to its corresponding Y coordinate. For example, if a first touch has the coordinates X1, Y1 and a second touch has the coordinates X4,Y4, sensing circuitry 210 may also detect "ghost" coordinates X1, Y4 and X4,Y1.

In one or more implementations, sensing circuitry 210 is configured to detect "areas" of touch-input corresponding to two or more touch-input points on the grid of conductive thread 202. Conductive threads 202 may be weaved closely together such that when an object touches the grid of conductive thread 202, the capacitance will be changed for multiple horizontal conductive threads 202 and/or multiple vertical conductive threads 202. For example, a single touch with a single finger may generate the coordinates X1,Y1 and X2,Y1. Thus, sensing circuitry 210 may be configured to detect touch-input if the capacitance is changed for multiple horizontal conductive threads 202 and/or multiple vertical conductive threads 202. Note that this removes the effect of ghosting because sensing circuitry 210 will not detect touch-input if two single-point touches are detected which are spaced apart.

Alternately, when implemented as a projective capacitance sensor, sensing circuitry 210 charges a single set of conductive threads 202 (e.g., horizontal conductive threads 202) by applying a control signal (e.g., a sine signal) to the single set of conductive threads 202. Then, sensing circuitry 210 senses changes in capacitance in the other set of conductive threads 202 (e.g., vertical conductive threads 202).

In this implementation, vertical conductive threads 202 are not charged and thus act as a virtual ground. However, when horizontal conductive threads 202 are charged, the horizontal conductive threads capacitively couple to vertical conductive threads 202. Thus, when an object, such as the user's finger, touches the grid of conductive thread 202, the capacitance changes on the vertical conductive threads (e.g., increases or decreases). Sensing circuitry 210 uses the change in capacitance on vertical conductive threads 202 to identify the presence of the object. To do so, sensing circuitry 210 detects a position of the touch-input by scanning vertical conductive threads 202 to detect changes in capacitance. Sensing circuitry 210 determines the position of the touch-input as the intersection point between the vertical conductive thread 202 with the changed capacitance, and the horizontal conductive thread 202 on which the control signal was transmitted. For example, sensing circuitry 210 can determine touch data by determining the position of each touch as X,Y coordinates on the grid of conductive thread 202.

Whether implemented as a self-capacitance sensor or a projective capacitance sensor, the conductive thread 202 and sensing circuitry 210 is configured to communicate the touch data that is representative of the detected touch-input to external electronics module 206, which is removably coupled to interactive object 104 via communication interface 208. The microprocessor 212 may then cause communication of the touch data, via network interface 216, to computing device 106 to enable the device to determine gestures based on the touch data, which can be used to control object 104, computing device 106, or applications implemented at computing device 106.

The computing device 106 can be implemented to recognize a variety of different types of gestures, such as touches, taps, swipes, holds, and covers made to interactive textile 102. To recognize the various different types of gestures, the computing device can be configured to determine a duration of the touch, swipe, or hold (e.g., one second or two seconds), a number of the touches, swipes, or holds (e.g., a single tap, a double tap, or a triple tap), a number of fingers of the touch, swipe, or hold (e.g., a one finger-touch or swipe, a two-finger touch or swipe, or a three-finger touch or swipe), a frequency of the touch, and a dynamic direction of a touch or swipe (e.g., up, down, left, right). With regards to holds, the computing device 106 can also determine an area of the grid of conductive thread 202 that is being held (e.g., top, bottom, left, right, or top and bottom. Thus, the computing device 106 can recognize a variety of different types of holds, such as a cover, a cover and hold, a five finger hold, a five finger cover and hold, a three finger pinch and hold, and so forth.

In one or more implementations, communication interface 208 is implemented as a connector that is configured to connect external electronics module 206 to internal electronics module 204 of interactive object 104. Consider, for example, FIG. 4 which illustrates an example 400 of a connector for connecting an external communications module to an interactive object in accordance with one or more implementations. In example 400, interactive object 104 is illustrated as a jacket.

As described above, interactive object 104 includes an internal electronics module 204 which include various types of electronics, such as sensing circuitry 210, sensors (e.g., capacitive touch sensors woven into the garment, microphones, or accelerometers), output devices (e.g., LEDs, speakers, or micro-displays), electrical circuitry, and so forth.

Figure 10:
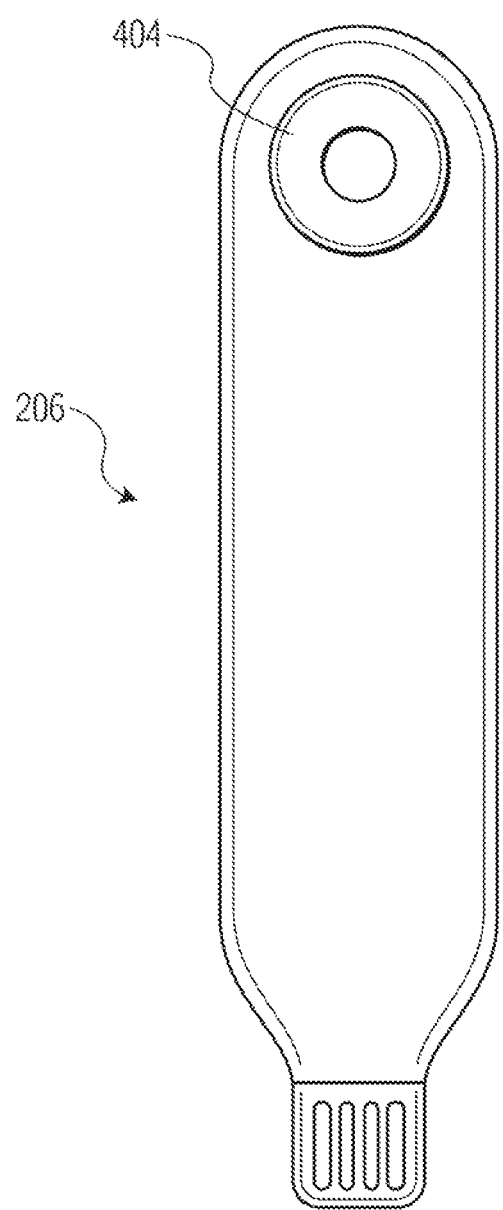
FIG. 10 illustrates an external electronics module in accordance with one or more implementations.

External electronics module 206 which is also shown in FIG. 10 includes various electronics that are configured to connect and/or interface with the electronics of internal electronics module 204. Generally, the electronics contained within external electronics module 206 are different than those contained within internal electronics module 204, and may include electronics such as microprocessor 212, power source 214 (e.g., a battery), network interface 216 (e.g., Bluetooth or WiFi), sensors (e.g., accelerometers, heart rate monitors, or pedometers), output devices (e.g., speakers, LEDs), and so forth.

In this example, external electronics module 206 is implemented as a strap that contains the various electronics. The strap, for example, can be formed from a material such as rubber, nylon, or any other type of fabric. Notably, however, external electronics module 206 may take any type of form. For example, rather than being a strap, external electronics module 206 could resemble a circular or square piece of material (e.g., rubber or nylon).

Figure 4:
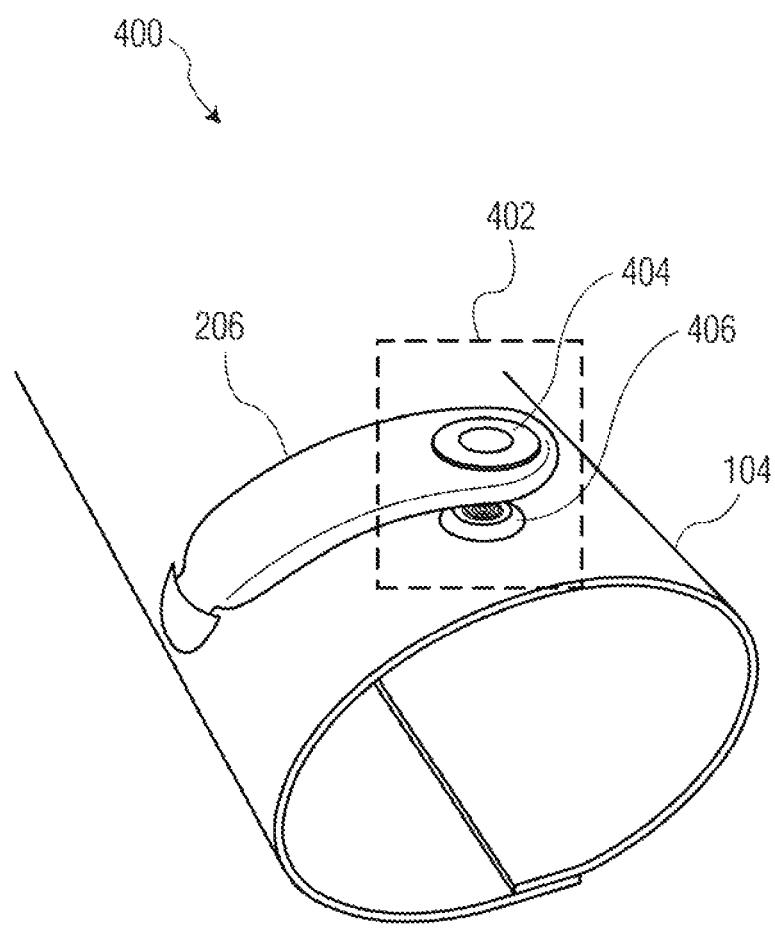
FIG. 4 illustrates an example of a connector for connecting an external communications module to an interactive object in accordance with one or more implementations.

Referring to FIGS. 5-8, the internal electronics module 204 is shown in more detail. The internal electronics module 204, for instance, can be located on the interior of the sleeve as shown in FIG. 4 and attached to connector receptacle 406. In the embodiment illustrated in FIGS. 5-8, the conductive threads 202 are also illustrated. The conductive threads 202 are substantially linear from end to end and form a parallel array.

Figure 5:
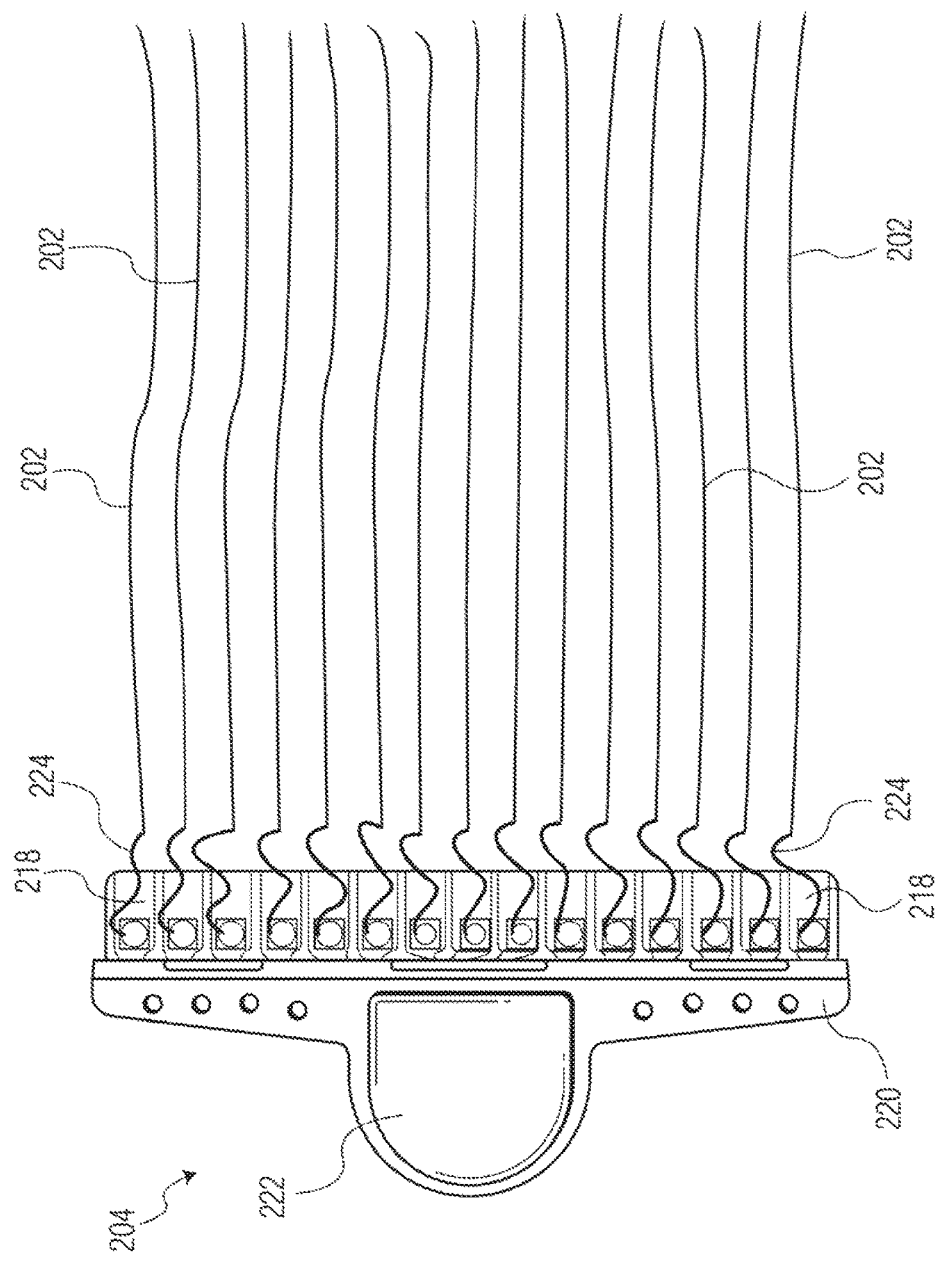
FIG. 5 illustrates an example of an internal electronics module shown connected to a plurality of conductive threads.
Figure 6:
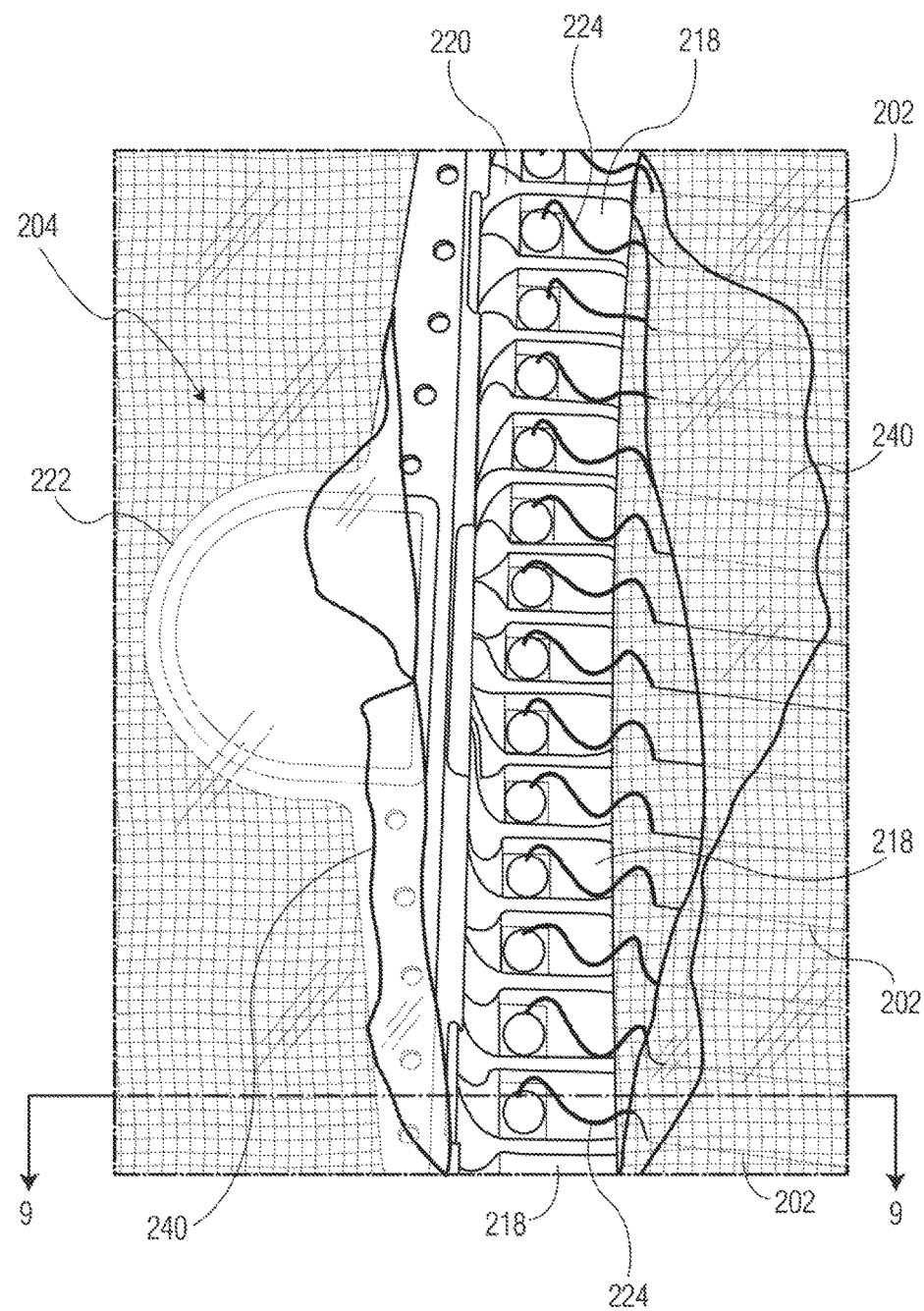
FIG. 6 illustrates the internal electronics module as shown in FIG. 5 in greater detail.

As shown in FIGS. 5 and 6, the internal electronics module 204 includes, in one embodiment, a plurality of electrical contact pads 218. The electrical contact pads 218 are spaced sequentially along the width of a flexible substrate 220. The flexible substrate and the electrical contact pads, for instance, may comprise a flexible printed circuit board. The printed circuit board can include a first portion containing the electrical contact pads and a second portion 222 that is in communication with the electrical contact pads. The second portion 222 may comprise a controller or be part of a controller and can include a microprocessor, a network interface, one or more sensors, output devices, and the like. As shown in FIGS. 5 and 6, the second portion 222 of the printed circuit board can be overmolded with a polymer composition. In one embodiment, for instance, the polymer composition may comprise a rigid polymer and may be attached to the receptacle 406 as shown in FIG. 4. The rigid polymer, for instance, may comprise a polystyrene, a polyvinyl chloride, a polyester, or the like. In this manner, the internal electronics module 204 includes a rigid portion for supporting the receptacle 406 while retaining a first portion containing the electrical contact pads 218 that remains flexible. The electrical contact pads 218, for instance, can flex and bend when the interactive object 104 is in use in order to prevent breakages from occurring with the conductive threads 202.

As described above, the conductive threads 202 are generally in a parallel arrangement. Each conductive thread 202 is connected to a separate and corresponding electrical contact pad 218. By maintaining the conductive threads 202 in a linear and parallel relationship, various advantages and benefits are obtained. For instance, the conductive threads 202 can be integrated or woven into the interactive object in a relatively simple weaving process without having to in any way funnel the conductive threads to the internal electronics module. In addition, the conductive threads 202 remained spaced apart the same distance from start to end which may, in some embodiments, simplify the touch-input information and/or prevent against interference from an adjacent conductive thread.

Figure 7:
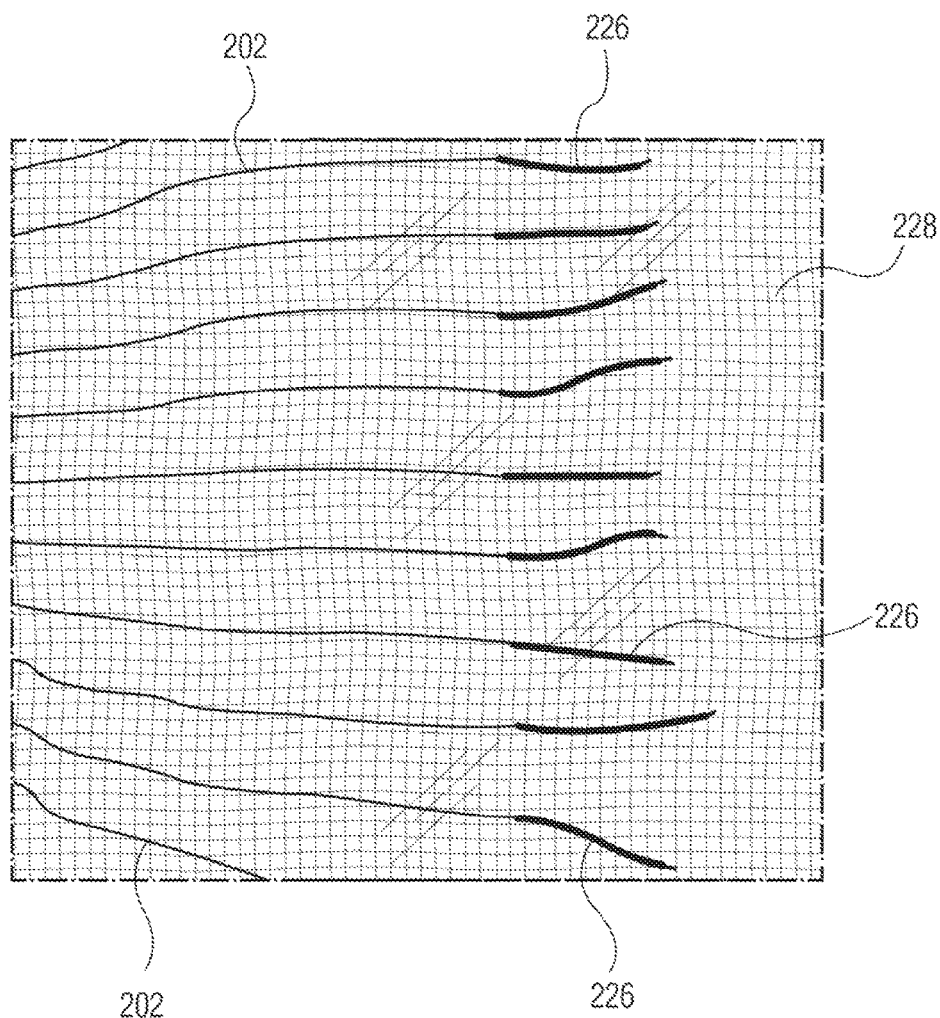
FIG. 7 illustrates an example of conductive threads that may be used as a capacitive touch sensor in interactive objects in accordance with one or more implementations.

As shown in FIGS. 5-7, the conductive threads extend a certain distance within the interactive object. The distance is sufficient for a capacitive touch sensor to form. In one embodiment, the conductive threads 202 are integrated or woven into the interactive object over a significant part of the length of the thread, such as at least 60% of the length of the thread, such as at least 70% of the length of the thread. Each conductive thread, however, can include a free end section at a first end and a free end section at an opposite and second end. Each free end section includes a portion of the conductive thread that is not integrated into the interactive object.

For instance, as shown in FIGS. 5 and 6, the first end of each conductive thread can include a free end section 224. As shown particularly in FIG. 6, the free end section 224 extends from where the conductive thread is attached to a corresponding electrical contact pad 218 to where the conductive thread enters and becomes integrated with the fabric of the interactive object. In accordance with the present disclosure, the free end section 224 of each conductive thread includes slack between the electrical contact pad 218 and the location where the thread enters the interactive object. In the embodiment illustrated in FIG. 6, the slack has an S-like configuration that provides strain relief so that the interactive object can flex, bend and twist without the conductive thread disengaging from the electrical contact pad.

The amount of slack contained in the conductive thread can vary depending upon the particular interactive object and various other factors. In one embodiment, for instance, the slack has a distance that is at least about 50%, such as at least about 60%, such as at least about 70%, such as at least about 80%, such as at least about 90%, such as even at least about 100% greater than the linear distance between the location on the electrical contact pad 218 where the conductive thread 202 is connected and the location where the conductive thread becomes integrated into the interactive object. The slack distance is generally about 300% less than the linear distance between the location on the electrical contact pad 218 where the conductive thread 202 is connected and the location where the conductive thread becomes integrated into the interactive object.

Referring to FIG. 7, the second and opposite end of the conductive threads 202 is illustrated. As shown, the second end of the conductive threads 202 also includes a free end section 226. As shown, the free end section 226 of the conductive threads 202 is not woven or integrated into the fabric of the interactive object. These free end sections 226 also provide strain relief and allow for the underlying fabric to bend, flex and even shrink without causing damage to the capacitive touch sensor or to the connection between the conductive threads 202 and the internal electronics module 204.

As also shown in FIG. 7, in one embodiment, the free end sections 226 can be laminated to the interactive object by a film 228. The film 228, for instance, can be made from a polymer that is heat sealed to the interactive object. Alternatively, an adhesive may be applied to the free end sections 226 if desired. In an alternative embodiment, however, the free end sections 226 may remain in an open and free state within the garment.

Figure 8:
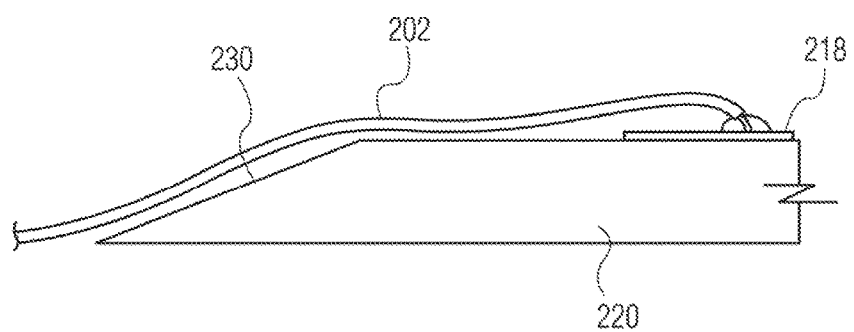
FIG. 8 illustrates a cross-section of another embodiment of an internal electronics module in accordance with one or more implementations showing attachment to a conductive thread.

In the embodiment particularly illustrated in FIG. 6, as described above, the free end sections 224 of the conductive threads 202 provide strain relief when the interactive object is subjected to various forces. Referring to FIG. 8, an alternative embodiment of a method for providing strain relief to the conductive threads 202 is illustrated. In FIG. 8, a conductive thread 202 is shown attached to an electrical contact pad 218 that resides on a substrate, such as a flexible substrate 220. In accordance with the present disclosure, the substrate 220 includes a ramp portion 230. The conductive thread 202 is disposed along the ramp portion 230 as the thread extends from the interactive object to the electrical contact pad 218. The ramp portion 230 provides for a gradual elevation change from the interactive object to the electrical contact pad. In this manner, the conductive thread is less likely to be subjected to forces sufficient to cause damage. Optionally, the conductive threads 202 can be secured to the ramp portion 230 using a suitable adhesive.

Figure 9:
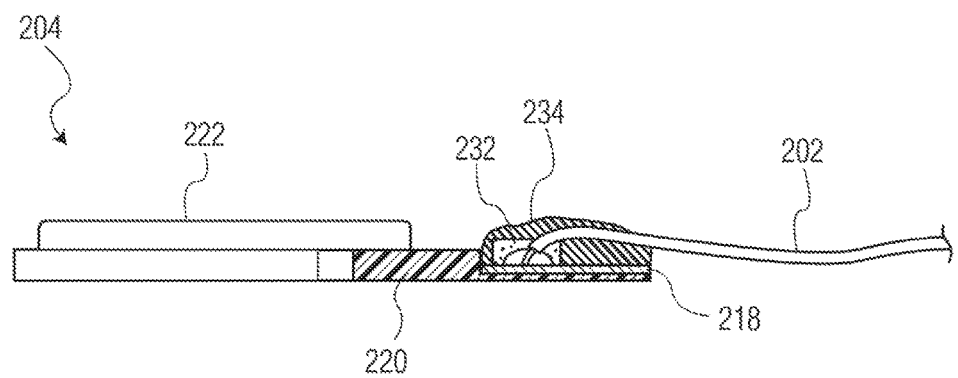
FIG. 9 illustrates a cross-section of the internal electronics module shown in FIGS. 5 and 6.

Once installed in the interactive garment, the internal electronics module 204 can be protected from moisture and corrosion. In this regard, the interactive object can include various different coatings and processes to protect the different components. For instance, referring to FIG. 9, a cross-sectional view of the internal electronics module 204 is illustrated. As shown, the conductive thread 202 is connected to the electrical contact pad 218. In one embodiment, for instance, the conductive thread 202 is connected to the electrical contact pad 218 with solder.

In one embodiment, after bonding the conductive thread 202 to the electrical contact pad 218, a sealing and encapsulation process may be applied to protect the conductive threads and the electric component from water ingress and corrosion. For instance, the location where the conductive thread 202 is attached to the electrical contact pad 218 can be coated with a rigid adhesive 232. The rigid adhesive, for instance, may comprise a curable adhesive, such as an epoxy. The epoxy, for instance, may be UV-curable or heat-curable.

After the connection point between the conductive thread 202 and the electrical contact pad 218 is sealed by the rigid adhesive 232, the connection point and optionally a portion of the conductive thread 202 can then be encapsulated by an elastomeric polymer 234. The elastomeric polymer, for instance, may comprise any suitable thermoplastic polymer or thermoplastic elastomer. For example, the elastomeric polymer 234 may comprise a copolyester elastomer, a thermoplastic polyurethane elastomer, or the like.

In one embodiment, as shown in FIGS. 5 and 6, the entire internal electronics module 204 can be laminated to the interactive object by a water impermeable film 240. For instance, in one embodiment, the water impermeable film 240 may comprise a polyurethane film that is heat sealed to the interactive object. In one embodiment, the water impermeable film can also cover the conductive threads 202. The water impermeable film 240 can further protect the internal electronics module and the conductive threads 202 from moisture and corrosion.

The internal electronics module 204 can include a receptacle 406 that can be used to communicate with the external electronics module 206.

Figure 11:
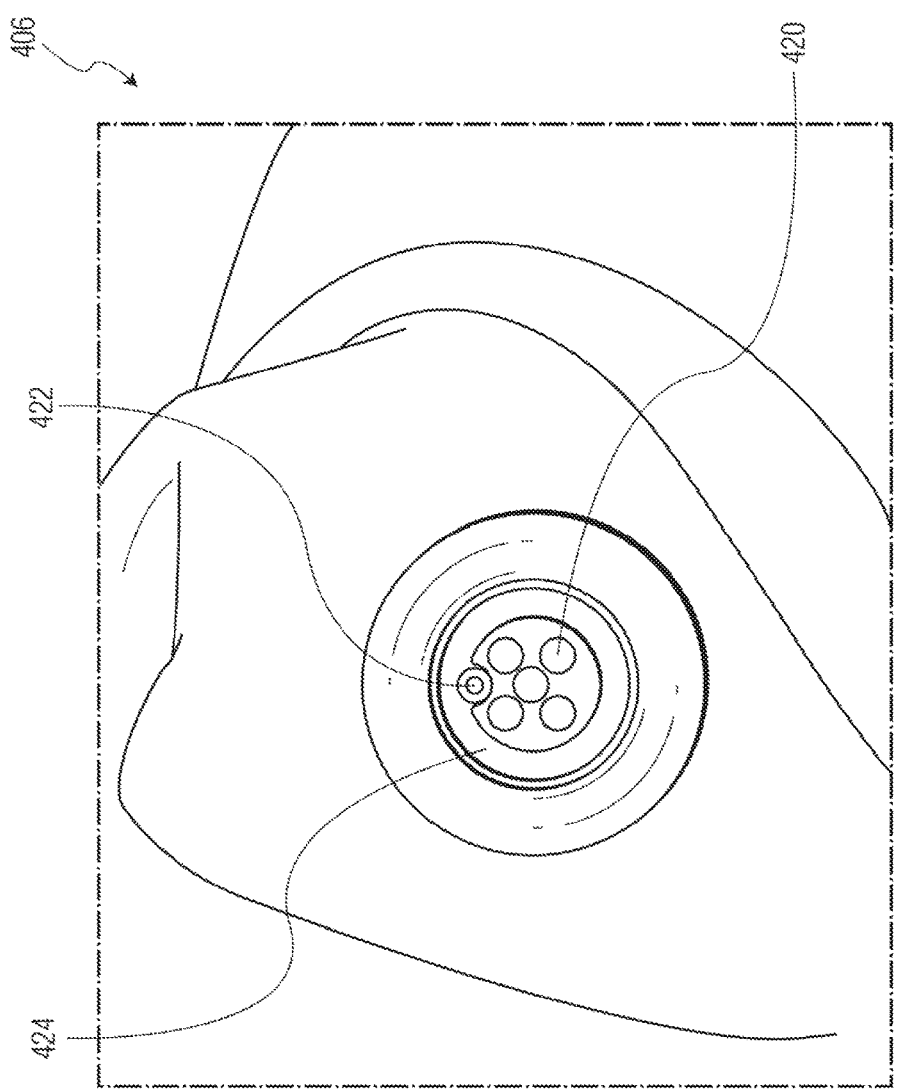
FIG. 11 illustrates an example of a receptacle on an internal electronics module in accordance with one or more implementations.
Figure 12:
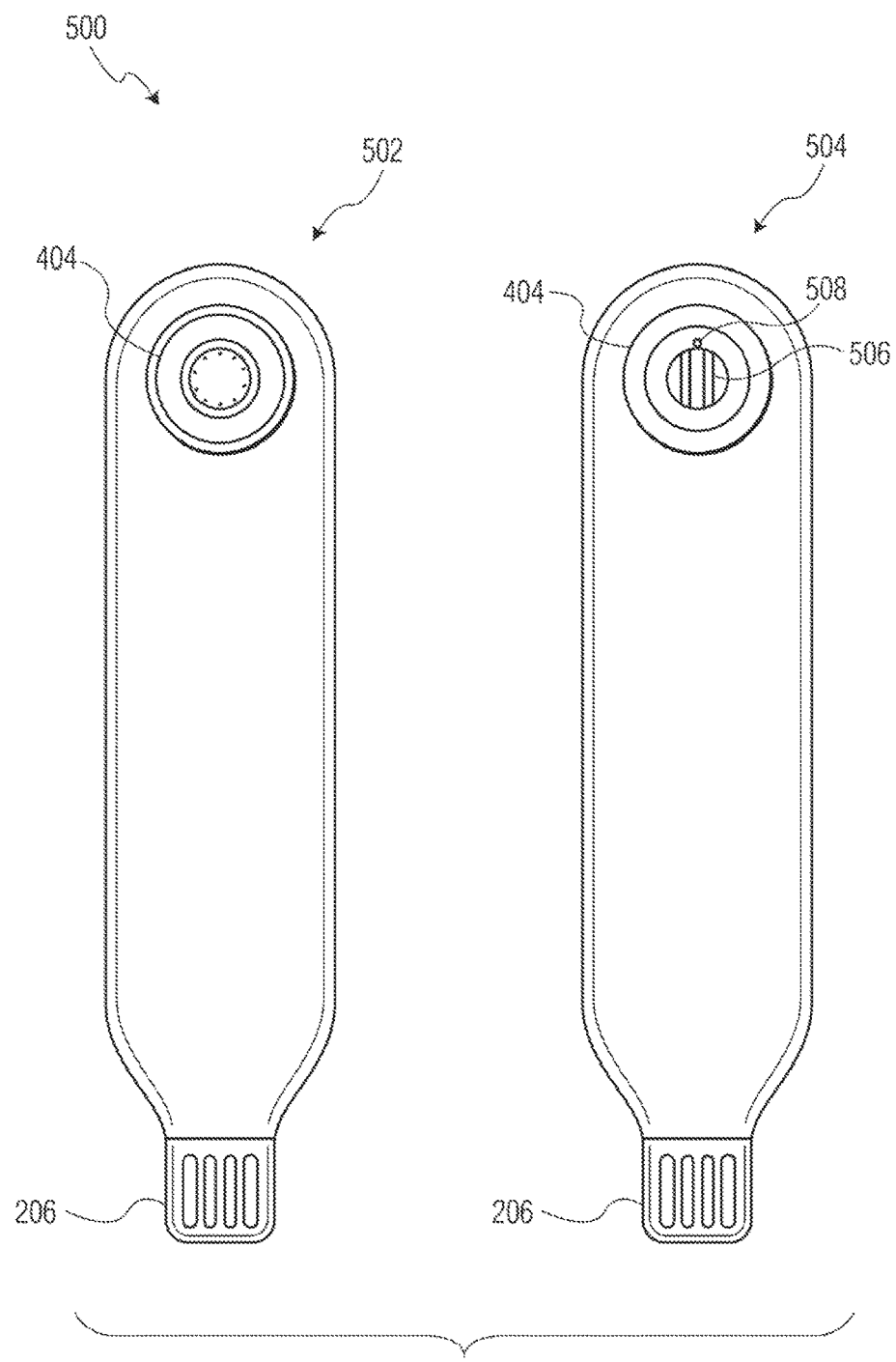
FIG. 12 illustrates an example of a connector when implemented in accordance with one or more implementations.

For instance, referring to FIGS. 4, 11 and 12, connector 402 includes the connector plug 404 and a connector receptacle 406. In this example, connector plug 404 is positioned on external electronics module 206 and is configured to attach to connector receptacle 406, which is positioned on interactive object 104, to form an electronic connection between external electronics module 206 and interactive object 104. For example, in FIG. 4, connector receptacle 406 is positioned on a sleeve of interactive object 104, which is illustrated as a jacket. In one embodiment, as shown in FIG. 4, the jacket can include a small pocket or opening that can receive the second end of the external electronics module 206.

In various implementations, connector plug 404 may resemble a snap or button, and is configured to connect or attach to connector receptacle 406 via a magnetic and/or mechanical coupling. For example, in some implementations magnets on connector plug 404 and connector receptacle 406 cause a magnetic connection to form between connector plug 404 and connector receptacle 406. Alternately, a mechanical connection between these two components may cause the components to form a mechanical coupling, such as by "snapping" together.

Connector 402 may be implemented in a variety of different ways. In one or more implementations, connector plug 404 includes an anisotropic conducting polymer which is configured to connect to circular pads of a printed circuit board (PCB) implemented at connector receptacle 406. In another implementation, connector plug 404 may include compliant polyurethane polymers to provide compliance to metal pads implemented at connector receptacle 406 to enable an electromagnetic connection. In another implementation, connector plug 404 and connector receptacle 406 may each include magnetically coupled coils which can be aligned to provide power and data transmission.

FIG. 11 illustrates one embodiment of a receptacle 406 that may be part of the internal electronics module 204, while FIG. 12 illustrates an example 500 of both sides of the connector plug 404 attached to the external electronics module 206. As shown in FIG. 11, the receptacle 406 includes a plurality of circular pads 420 that may be part of a printed circuit board. In addition, the receptacle 406 can include a sealing ring 424. The sealing ring 424 can be made from a rubber or resilient polymer material that helps form a better connection between the internal electronics module 204 and the external electronics module 206.

At 502, a top side of connector plug 404 is shown. In this case, the top side of connector plug 404 resembles a round, button-like structure. Notably the top side of connector plug 404 may be implemented with various different shapes (e.g., square or triangular). Further, in some cases the top side of connector plug 404 may resemble something other than a button or snap.

In this example, the top side of connector plug 404 includes tiny holes that enables light from light sources (e.g., LEDs) to shine through. Of course, other types of input or output units could also be positioned here, such as a microphone or a speaker.

At 504, a bottom side of connector plug 404 is shown. The bottom side of connector plug 404 includes an anisotropic conducting polymer 506 or other conductive material to enable electrical connections between the electronics of interactive object 104 and the electronics of external electronics module 206.

In one embodiment, the connector 402 can include an alignment device for aligning the internal electronics module with the external electronics module. For instance, in the embodiment illustrated in FIG. 11, the receptacle 406 includes a pin recess 422. Bottom side of connector plug 404 as shown in FIG. 12 can then include an alignment pin 508. The alignment pin 508 is configured to be inserted into the pin recess 422. In this manner, the pin recess and the alignment pin can ensure that the external electronics module 206 is aligned correctly on the interactive object when connected to the internal electronics module 204. The alignment device can also be used to ensure a proper electrical connection between the two modules.

Example Computing System

Figure 13:
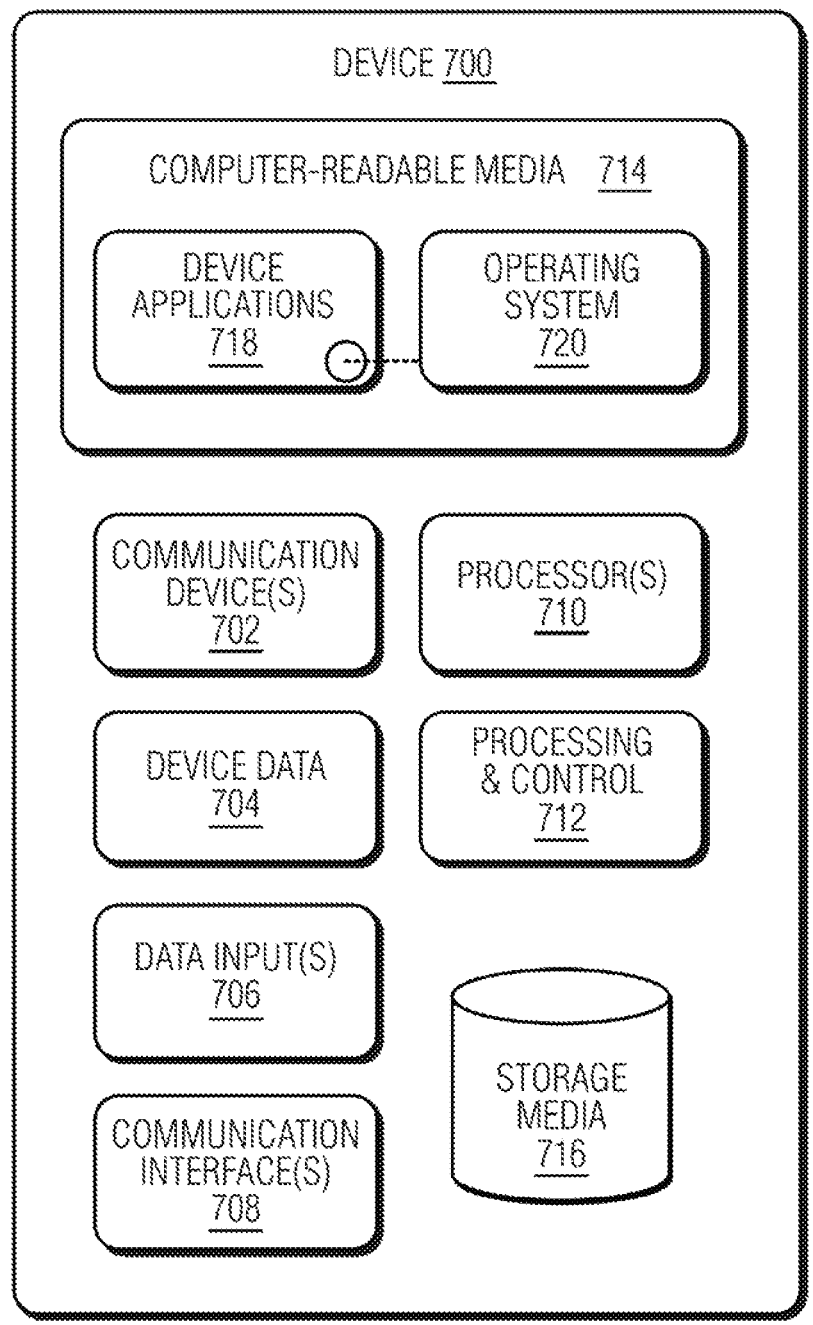
FIG. 13 illustrates various components of an example computing system that can be implemented as any type of client, server, and/or computing device as described with reference to the previous FIGS. 1-12 to implement an interactive object with multiple electronics modules.

FIG. 13 illustrates various components of an example computing system 700 that can be implemented as any type of client, server, and/or computing device as described with reference to the previous FIGS. 1-12 to implement an interactive object with multiple electronics modules. For example, computing system 700 may correspond to external electronics module 206 and/or embedded in interactive object 104. In embodiments, computing system 700 can be implemented as one or a combination of a wired and/or wireless wearable device, System-on-Chip (SoC), and/or as another type of device or portion thereof. Computing system 700 may also be associated with a user (e.g., a person) and/or an entity that operates the device such that a device describes logical devices that include users, software, firmware, and/or a combination of devices.

Computing system 700 includes communication devices 702 that enable wired and/or wireless communication of device data 704 (e.g., received data, data that is being received, data scheduled for broadcast, data packets of the data, etc.). Device data 704 or other device content can include configuration settings of the device, media content stored on the device, and/or information associated with a user of the device. Media content stored on computing system 700 can include any type of audio, video, and/or image data. Computing system 700 includes one or more data inputs 706 via which any type of data, media content, and/or inputs can be received, such as human utterances, user-selectable inputs (explicit or implicit), messages, music, television media content, recorded video content, and any other type of audio, video, and/or image data received from any content and/or data source.

Computing system 700 also includes communication interfaces 708, which can be implemented as any one or more of a serial and/or parallel interface, a wireless interface, any type of network interface, a modem, and as any other type of communication interface. Communication interfaces 708 provide a connection and/or communication links between computing system 700 and a communication network by which other electronic, computing, and communication devices communicate data with computing system 700.

Computing system 700 includes one or more processors 710 (e.g., any of microprocessors, controllers, and the like), which process various computer-executable instructions to control the operation of computing system 700 and to enable techniques for, or in which can be embodied, interactive textiles. Alternatively or in addition, computing system 700 can be implemented with any one or combination of hardware, firmware, or fixed logic circuitry that is implemented in connection with processing and control circuits which are generally identified at 712. Although not shown, computing system 700 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Computing system 700 also includes computer-readable media 714, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Computing system 700 can also include a mass storage media device 716.

Computer-readable media 714 provides data storage mechanisms to store device data 704, as well as various device applications 718 and any other types of information and/or data related to operational aspects of computing system 700. For example, an operating system 720 can be maintained as a computer application with computer-readable media 714 and executed on processors 710. Device applications 718 may include a device manager, such as any form of a control application, software application, signal-processing and control module, code that is native to a particular device, a hardware abstraction layer for a particular device, and so on. Device applications 718 also include any system components, engines, or managers to implement an interactive object with multiple electronics modules.

Conclusion

Although embodiments of techniques using, and objects including, an interactive object with multiple electronics modules has been described in language specific to features and/or methods, it is to be understood that the subject of the appended claims is not necessarily limited to the specific features or methods described. Rather, the specific features and methods are disclosed as example implementations of an interactive object with multiple electronics modules.

What is claimed is:

1. An interactive object comprising:
   a plurality of conductive threads, the conductive threads having a first end and a second and opposite end, the conductive threads being substantially linear and parallel from the first end to the second end, the conductive threads being integrated into the interactive object;
   an internal electronics module physically coupled to the interactive object, the internal electronics module comprising a flexible substrate having a width and a length and a plurality of electrical contact pads positioned sequentially along the width of the flexible substrate, each electrical contact pad being connected to a respective conductive thread of the plurality of conductive threads; and
   a controller in electrical communication with each of the electrical contact pads, the controller being configured to detect a touch-input when user pressure is applied to the conductive threads, the controller being configured to communicate touch-input data to a computing device; and
   an external electronics module that is removably coupled to the interactive object for communicating with the internal electronics module.

2. The interactive object of claim 1, wherein:
the interactive object is an interactive wearable garment configured to be worn by a user.

3. The interactive object of claim 2, wherein:
the interactive wearable garment comprises a sleeve;
the plurality of conductive threads are integrated into the sleeve; and
the internal electronics module is located on the sleeve.

4. The interactive object of claim 3, further comprising:
a receptacle communicatively coupled to the internal electronics module; and
an external electronics module that is removably coupled to the interactive wearable garment via the receptacle for communicating with the internal electronics module.

5. The interactive object of claim 1, wherein:
the interactive object is an interactive handbag; and
the plurality of conductive threads are integrated into a surface of the handbag.

6. The interactive object of claim 1, wherein:
the interactive object is a rigid object comprising at least one of a non-flexible material or a semi-flexible material;
the plurality of conductive threads are combined with a plurality of non-conductive threads to form an interactive textile; and
the interactive textile is integrated with the rigid object.

7. The interactive object of claim 6, wherein:
the rigid object comprises at least one of a chair, a bottle, a ball, or a car part.

8. The interactive object of claim 1, wherein:
the external electronics module comprises a power source; and
the external electronics module is configured to power the internal electronics module via the power source of the external electronics module.

9. The interactive object of claim 8, wherein:
the internal electronics module is integrated within the interactive object; and
the internal electronics module comprises the controller.

10. The interactive object of claim 9, wherein:
the controller comprises sensing circuitry configured to detect the touch-input and generate the touch-input data.

11. The interactive object of claim 8, wherein:
the external electronics module comprises the computing device.

12. The interactive object of claim 11, wherein:
the computing device is a first computing device;
the external electronics module is configured to communicate one or more control signals to a second computing device remote from the interactive object; and
the one or more control signals are based at least in part on the touch-input data.

13. The interactive object of claim 1, wherein:
the computing device is remote from the interactive object.

14. The interactive object of claim 13, wherein:
the computing device is integrated with an appliance.

15. An interactive object comprising:
a plurality of conductive threads, the conductive threads having a first end and a second and opposite end, the conductive threads being substantially linear and parallel from the first end to the second end, the conductive threads being integrated into the interactive object;
an internal electronics module coupled to the plurality of conductive threads, the internal electronics module comprising a flexible substrate having a width and a length and a plurality of electrical contact pads positioned sequentially along the width of the flexible substrate, each electrical contact pad being connected to a respective conductive thread, the internal electronics module comprising sensing circuitry in electrical communication with each of the electrical contact pads, the sensing circuitry being configured to detect a touch-input when a user touch is applied to the conductive threads; and
an external electronics module removably coupled to the interactive object for communicating with the internal electronics module, the external electronics module configured to communicate data to a remote computing device based at least in part on the touch-input detected by the sensing circuitry.

16. The interactive object of claim 15, wherein:
the interactive object is an interactive wearable garment configured to be worn by a user;
the interactive wearable garment comprises a sleeve;
the plurality of conductive threads are integrated into the sleeve;
the internal electronics module is located on the sleeve; and
the interactive object further comprises:
a receptacle communicatively coupled to the internal electronics module; and
an external electronics module that is removably coupled to the interactive wearable garment via the receptacle for communicating with the internal electronics module.

17. The interactive object of claim 15, wherein:
the interactive object further comprises an external electronics module that is removably coupled to the interactive object for communicating with the internal electronics module;
the external electronics module comprises a power source;
the external electronics module is configured to power the internal electronics module via the power source of the external electronics module;
the internal electronics module is integrated within the interactive object; and
the internal electronics module comprises sensing circuitry configured to detect the touch-input and generate the touch-input data.

18. An interactive object comprising:
a plurality of conductive threads, the conductive threads having a first end and a second and opposite end, the conductive threads being substantially linear and parallel from the first end to the second end, the conductive threads being integrated into the interactive object;
an internal electronics module coupled to the plurality of conductive threads, the internal electronics module comprising a flexible substrate having a width and a length and a plurality of electrical contact pads positioned sequentially along the width of the flexible substrate, each electrical contact pad being connected to a respective conductive thread; and
a controller in electrical communication with each of the electrical contact pads, the controller being configured to detect a touch-input when a user touch is applied to one or more of the plurality of conductive threads, the controller also being configured to communicate touch-input data to a computing device; and an external electronics module that is removably coupled to the interactive object for communicating with the internal electronics module.

19. The interactive object of claim 18, wherein:

the interactive object is an interactive wearable garment configured to be worn by a user;

the interactive wearable garment comprises a sleeve;

the plurality of conductive threads are integrated into the sleeve;

the internal electronics module is located on the sleeve; and the interactive object further comprises:
- a receptacle communicatively coupled to the internal electronics module; and
- an external electronics module that is removably coupled to the interactive wearable garment via the receptacle for communicating with the internal electronics module.

20. The interactive object of claim 18, wherein:

the external electronics module comprises a power source;

the external electronics module is configured to power the internal electronics module via the power source of the external electronics module;

the internal electronics module is integrated within the interactive object;

the internal electronics module comprises the controller; and the controller comprises sensing circuitry configured to detect the touch-input and generate the touch-input data.

* * * * *